United States Patent
Otto et al.

(10) Patent No.: US 11,437,550 B2
(45) Date of Patent: Sep. 6, 2022

(54) OPTOELECTRONIC COMPONENT AND METHOD OF PRODUCING AN OPTOELECTRONIC COMPONENT

(71) Applicant: OSRAM OLED GmbH, Regensburg (DE)

(72) Inventors: Isabel Otto, Regenstauf (DE); Holger Klassen, Regenstauf (DE); Berthold Hahn, Hemau (DE)

(73) Assignee: OSRAM OLED GmbH, Regensburg (DE)

(*) Notice: Subject to any disclaimer, the term of this patent is extended or adjusted under 35 U.S.C. 154(b) by 268 days.

(21) Appl. No.: 16/968,901

(22) PCT Filed: Feb. 11, 2019

(86) PCT No.: PCT/EP2019/053265
§ 371 (c)(1),
(2) Date: Aug. 11, 2020

(87) PCT Pub. No.: WO2019/158465
PCT Pub. Date: Aug. 22, 2019

(65) Prior Publication Data
US 2021/0050490 A1 Feb. 18, 2021

(30) Foreign Application Priority Data
Feb. 13, 2018 (DE) .................... 10 2018 103 160.2

(51) Int. Cl.
*H01L 23/544* (2006.01)
*H01L 33/50* (2010.01)
*H01L 33/00* (2010.01)

(52) U.S. Cl.
CPC .......... *H01L 33/504* (2013.01); *H01L 33/005* (2013.01); *H01L 2933/0033* (2013.01)

(58) Field of Classification Search
CPC ...................................... H01L 23/544
(Continued)

(56) References Cited

U.S. PATENT DOCUMENTS 11,145,689 B2 * 10/2021 Hall ...................... H01L 33/005
2013/0069525 A1 3/2013 Imai
(Continued)

FOREIGN PATENT DOCUMENTS

DE  10 2015 100 294 A1  7/2015
WO  2017/121833 A1  7/2017
WO  2017/191966 A1  11/2017

*Primary Examiner* — Hsin Yi Hsieh
(74) *Attorney, Agent, or Firm* — DLA Piper LLP (US)

(57) ABSTRACT

An optoelectronic component that emits electromagnetic radiation from a radiation exit surface of the optoelectronic component includes a radiation-emitting semiconductor chip that produces electromagnetic radiation, and a marker element applied to the radiation exit surface of the optoelectronic component, the marker element including a dye substance that can be removed from the radiation exit surface using a solvent and/or is permeable to the electromagnetic radiation of the optoelectronic component, wherein the dye substance includes a resin into which fluorescent particles are introduced that convert electromagnetic radiation of a first wavelength range into electromagnetic radiation of a second wavelength range, the first wavelength range and the second wavelength range being within the ultraviolet spectral range.

9 Claims, 2 Drawing Sheets

(58) Field of Classification Search
USPC .......................................................... 257/98
See application file for complete search history.

(56) References Cited

U.S. PATENT DOCUMENTS

2015/0200338 A1  7/2015  Kim et al.
2019/0165226 A1  5/2019  Kim et al.

\* cited by examiner

OPTOELECTRONIC COMPONENT AND METHOD OF PRODUCING AN OPTOELECTRONIC COMPONENT

TECHNICAL FIELD

This disclosure relates to an optoelectronic component and a method of producing a optoelectronic component.

BACKGROUND

There is a need for an optoelectronic component that can be assembled particularly easily and a method of producing a component that can be particularly easily assembled.

SUMMARY

We provide an optoelectronic component that emits electromagnetic radiation from a radiation exit surface of the optoelectronic component including a radiation-emitting semiconductor chip that produces electromagnetic radiation, and a marker element applied to the radiation exit surface of the optoelectronic component, the marker element including a dye substance that can be removed from the radiation exit surface using a solvent and/or is permeable to the electromagnetic radiation of the optoelectronic component, wherein the dye substance includes a resin into which fluorescent particles are introduced that convert electromagnetic radiation of a first wavelength range into electromagnetic radiation of a second wavelength range, the first wavelength range and the second wavelength range being within the ultraviolet spectral range.

We also provide a method of producing an optoelectronic component including applying a dye substance to a radiation exit surface of the optoelectronic component to produce a marker element, wherein the dye substance can be removed from the radiation exit surface with a solvent and/or is permeable to the electromagnetic radiation of the optoelectronic component, and the dye substance includes a resin into which fluorescent particles are introduced that convert electromagnetic radiation of a first wavelength range into electromagnetic radiation of a second wavelength range, the first wavelength range and the second wavelength range being within the ultraviolet spectral range.

Figure 1:
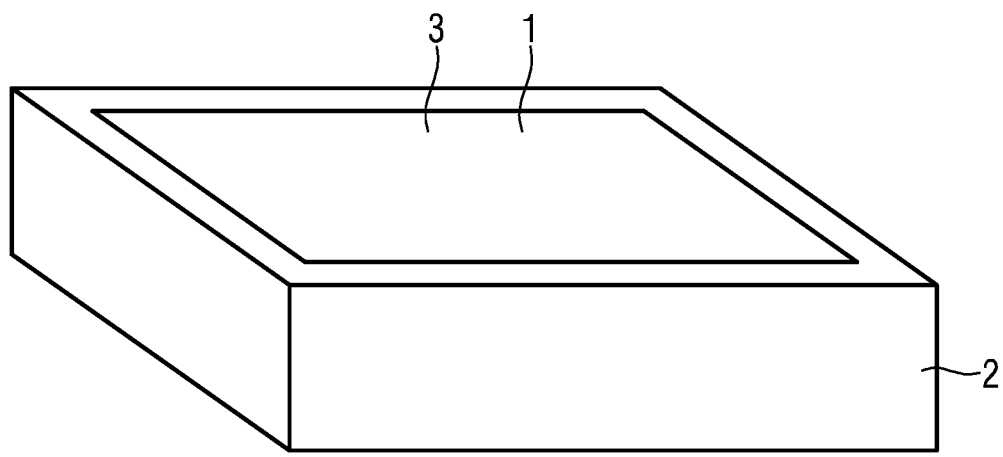
FIGS. 1 and 2 are schematic perspective views of a method of producing an optoelectronic component according to an example.

LIST OF REFERENCE SIGNS 1 semiconductor chip
2 frame
3 radiation exit surface
4 dye substance
5 marker element
6 conversion element

DETAILED DESCRIPTION

Our optoelectronic component may have a radiation exit surface from which the electromagnetic radiation of the optoelectronic component is emitted during operation. The optoelectronic component may comprise a radiation-emitting semiconductor chip that generates electromagnetic radiation. The radiation-emitting semiconductor chip can be a light-emitting diode chip, for example. The radiation-emitting semiconductor chip can also have a radiation exit surface from which the electromagnetic radiation generated during operation is emitted. The radiation exit surface of the optoelectronic component may be formed entirely or partially by the radiation exit surface of the semiconductor chip. It is also possible that a conversion element is applied to the radiation exit surface of the radiation-emitting semiconductor chip, which converts electromagnetic radiation from the radiation-emitting semiconductor chip into electromagnetic radiation of a different wavelength range. Such a conversion element is described in more detail below.

The radiation exit surface of the semiconductor chip can be designed such that it continuously emits radiation over the entire surface. It is also possible that the radiation exit surface has a plurality of radiation-emitting sub-regions separated from each other by non-radiating regions. For example, the sub-regions can be grouped into pixels or can form pixels.

The electromagnetic radiation generated by the radiation-emitting semiconductor chip can be, for example, infrared radiation, visible light or ultraviolet radiation.

The optoelectronic component may comprise a marker element. The marker element is particularly preferably applied to the radiation exit surface of the optoelectronic component.

The marker element particularly preferably comprises a dye substance or is formed from a dye substance that can be removed from the radiation exit surface using a solvent. Alternatively or in addition, it is also possible that the dye substance is permeable to the electromagnetic radiation of the optoelectronic component.

"Permeable to the electromagnetic radiation of the optoelectronic component" particularly preferably means that the dye substance transmits at least 80%, preferably at least 90% and, particularly preferably at least 95% of the electromagnetic radiation of the optoelectronic component.

If the marker element comprises a dye substance that can be removed from the radiation exit surface using a solvent, this can advantageously at least reduce the aging of the component. In particular, no loss of efficiency of the component over the operating period is expected.

The marker element is preferably applied to the conversion element, while a spatial region of the conversion element is preferably free from the marker element. In components with a comparatively small radiation exit surface, such an arrangement of the marker element, the dye substance of which can be removed from the radiation exit surface using a solvent and/or is permeable to the electromagnetic radiation of the optoelectronic component, prevents a loss of the luminous surface compared to a conversion element with an integrated marker element.

For example, the dye substance absorbs a certain wavelength range of visible light in particular, and thus exhibits a color impression for the human eye.

For example, the absorbent dye substance is made of one of the following materials or has one of the following materials: $TiO_2$, $Fe_2O_3$, C, $BiVO_4$, $Fe_4[Fe(CN)_6]_3$ (Prussian blue).

However, it is particularly preferred that the dye substance is designed to be wavelength-converting. For example, the dye substance comprises a resin such as a silicone or an epoxy into which fluorescent particles are introduced. The fluorescent particles preferably provide the dye substance with the wavelength-converting properties. The fluorescent particles are suitable for converting electromagnetic radiation of a first wavelength range into electromagnetic radiation of a second wavelength range. The second wavelength range preferably comprises longer wavelengths than the first wavelength range. For example, the first wavelength range and the second wavelength range are in the ultraviolet spectral range. The first wavelength range and/or the second wavelength range particularly preferably not included in the electromagnetic radiation emitted by the optoelectronic component.

For example, the fluorescent particles are formed from one of the following materials or have one of the following materials: ZnS, for example, doped with Mn, Ag, Cu or Ln, $LaMgAl_{11}O_{19}$:Ce, $YPO_4$:Ce, $BaSi_2O_5$:Pb, $Sr_2MgSi_2O_7$:Pb, $SrB_4O_7$:Eu, $SrAl_{12}O_{19}$:Ce, $LaPO_4$:Ce, $LaB_3O_6$:Bi, Gd, $YBO_3$:Pr, $YAlO_3$:PR, $YPO_4$:Bi, $CaSO_4$:Pb.

The marker element may mark the position of at least one electrical contact of the optoelectronic component. The electrical contact is particularly preferably arranged on the rear side of the optoelectronic component, which is opposite the radiation exit surface.

The optoelectronic component may have at least two electrical contacts. The two electrical contacts of the optoelectronic component are particularly preferably arranged on its rear side. For example, the electrical contacts are strip-shaped and run essentially parallel to each other from one side face of the optoelectronic component to an opposite side of the optoelectronic component.

Preferably, the dye substance is designed to absorb in the ultraviolet spectral range. For example, the dye substance absorbs in the ultraviolet spectral range and due to wavelength-converting fluorescent particles, emits electromagnetic radiation of a second wavelength range in the longer-wavelength ultraviolet spectral range or in the visible spectral range. In this example, the optoelectronic device preferably emits electromagnetic radiation, which is neither in the first wavelength range nor in the second wavelength range.

The radiation exit surface of the optoelectronic component need not be more than 14% smaller than the cross-sectional area of the optoelectronic component. In this example, the cross-sectional area is particularly preferably located in the same plane as the radiation exit surface. In other words, the main surface comprising the radiation exit surface of the optoelectronic component is not very much larger than the radiation exit surface. For example, the optoelectronic component, in addition to the semiconductor chip, comprises only a narrow frame that surrounds the radiation exit surface and thus contributes only a very small proportion of the surface area of the main surface comprising the radiation exit surface. For example, the size of the cross-sectional area is 150 microns by 150 microns to 2 millimeters by 2 millimeters.

The marker element may have a dimension of at least 140 microns. Such a marker element is advantageously suitable for detection by common detection devices in the assembly.

For example, the marker element can be a square, rectangle, or diamond shape. The marker element particularly preferably has a shape that is automatically generated using one of the production methods described below. For example, the marker element is formed as a simple spot. For example, a dimension of the marker element can be a side length, a radius, or else a diameter.

The marker element is particularly preferably not arranged rotationally symmetrically with respect to a point of symmetry of the radiation exit surface and/or the front side of the optoelectronic component.

If the marker element is intended to be removed from the radiation exit surface again, for example, after the component has been fully assembled, a solvent is preferably used for this purpose. The solvent used to remove the marker may be water, ethanol, acetone, or isopropanol.

The optoelectronic component may have a conversion element suitable for converting electromagnetic radiation of the semiconductor chip wholly or partially into electromagnetic radiation of a third wavelength range. For example, the radiation exit surface of the optoelectronic component is formed by a main surface of the conversion element.

If the conversion element converts the electromagnetic radiation of the semiconductor chip as completely as possible into electromagnetic radiation of the third wavelength range, the optoelectronic component will emit electromagnetic radiation of the third wavelength range. In this example, it is particularly preferable that the dye substance of the marker element is permeable to the electromagnetic radiation of the third wavelength range.

Alternatively, it is also possible that the conversion element is designed to only partially convert the electromagnetic radiation of the semiconductor chip into electromagnetic radiation of the third wavelength range so that the optoelectronic component emits electromagnetic radiation from its radiation exit surface that is composed of converted radiation of the third wavelength range and unconverted radiation from the electromagnetic semiconductor chip. In this example, it is particularly preferable that the dye substance of the marker element is permeable to the electromagnetic radiation of the semiconductor chip and the electromagnetic radiation of the third wavelength range.

The optoelectronic component described here can be produced, for example, using the method described below. Features and designs, which in this example are described only in connection with the optoelectronic component, can also be implemented in the method, where appropriate, and vice versa.

In an example of the method, the dye substance is applied to the radiation exit surface of the optoelectronic component to produce the marker element.

For example, the dye substance can be applied from a cartridge by applying pressure by jetting through a jet valve. In this example, a drop of the dye substance is generated when pressure is applied, which is then applied to the radiation exit surface. For example, the drop has a mass of 10 micrograms to 100 micrograms. In particular, this method can be used to process dye substances with a viscosity of 10 Pa*s to 0.001 Pa*s. To adjust the viscosity to a desired value, the dye substance can be diluted with a solvent.

It is also possible that the dye substance is applied from a cartridge by applying pressure by dispensing through a needle. This example of the method is particularly suitable for dye substances with a viscosity of 10000 Pa*s to 0.01 Pa*s.

Finally, it is possible that the dye substance is applied from an open-pored membrane or a capillary on contact with the surface on which the dye substance is to be applied such as the radiation exit surface, by inking. In this example, the capillary or membrane can be mechanically guided either manually or automatically. This example is also particularly suitable for dye substances with a viscosity of 10000 Pa*s to 0.01 Pa*s.

In this example, it is proposed that the marker element, which is used to mark the position of a rear-side electrical contact, be applied to the radiation exit surface of the optoelectronic component. Thus, the marker element is located on the front side of the optoelectronic component so that the optoelectronic component can usually be mounted easily, for example, on a terminal carrier.

Particularly for components in which the radiation exit surface occupies most of the front side, application of the marker element on the radiation exit surface may sometimes be unavoidable, as otherwise there is not sufficient space available on the front side.

Preferably, the marker element can either be removed from the radiation exit surface again, or else the marker element has a dye substance or is formed from a dye substance that is permeable to the electromagnetic radiation of the optoelectronic component. In this way, a marker element can be advantageously produced on the radiation exit surface that does not reduce the radiation characteristic of the component and/or the efficiency of the component.

Further advantages and developments arise from the examples described hereafter in connection with the figures.

Identical, similar or equivalently functioning elements are labelled with the same reference sign in the figures. The figures and the relative proportions of the elements represented in the figures are not to be considered to be true to scale. Instead, individual elements, especially layer thicknesses, can be shown exaggerated in size and/or for better visualization and/or better understanding.

Figure 2:
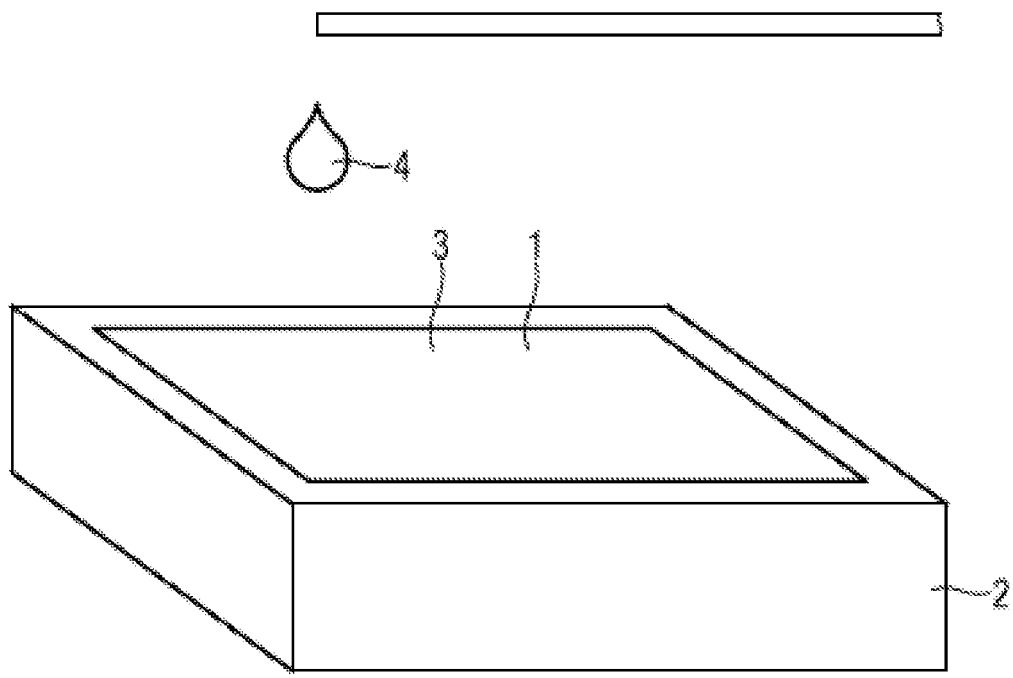

In the method of producing an optoelectronic component according to the examples of FIGS. 1 and 2, in a first step an optoelectronic component without a marker element 5 is provided. The optoelectronic component comprises a radiation-emitting semiconductor chip 1, which is completely enclosed by a circumferential frame 2. The frame replaces a component housing and provides the mechanical stability of the optoelectronic component. In this example, the front of the optoelectronic component is formed by a radiation exit surface of the radiation-emitting semiconductor chip 1 and a front surface of the frame 2.

In this example, the radiation exit surface of the radiation-emitting semiconductor chip forms the radiation exit surface 3 of the optoelectronic component. The electromagnetic radiation of the optoelectronic component is emitted from the radiation exit surface 3 of the radiation-emitting semiconductor chip 1.

In a next step, which is schematically represented in FIG. 2, a dye substance 4 is applied to the radiation exit surface 3 of the optoelectronic component to generate a marker element 5. This can be carried out by jetting, for example. In jetting, the dye substance 4 is preferably forced out of a cartridge by applying pressure in the form of a drop with a defined mass.

It is also possible that the dye substance 4 is dispensed from a cartridge. During dispensing, the dye substance 4 is forced out of the cartridge by applying pressure through a needle in the form of a drop with defined mass, and applied to the radiation exit surface 3.

In particular, in jetting or dispensing, a drop is usually produced, which strikes the radiation exit surface 3 of the optoelectronic component and forms a more or less regular spot there as a marker element 5.

It is also possible that the dye substance 4 is applied to the radiation exit surface 3 from an open-pored membrane or a capillary. In this example, the dye substance 4 usually emerges from the membrane or capillary due to the surface forces.

The marker element 5 generated is suitable for marking an electrical contact on a rear side of the optoelectronic device opposite to the front side. For this purpose, the marker element 5 is particularly preferably applied asymmetrically with respect to a center of the front side or asymmetrically with respect to a rotation axis of the front side. For example, the marker element 5 is applied in a corner of the front side and/or the radiation exit surface 3.

Figure 3:
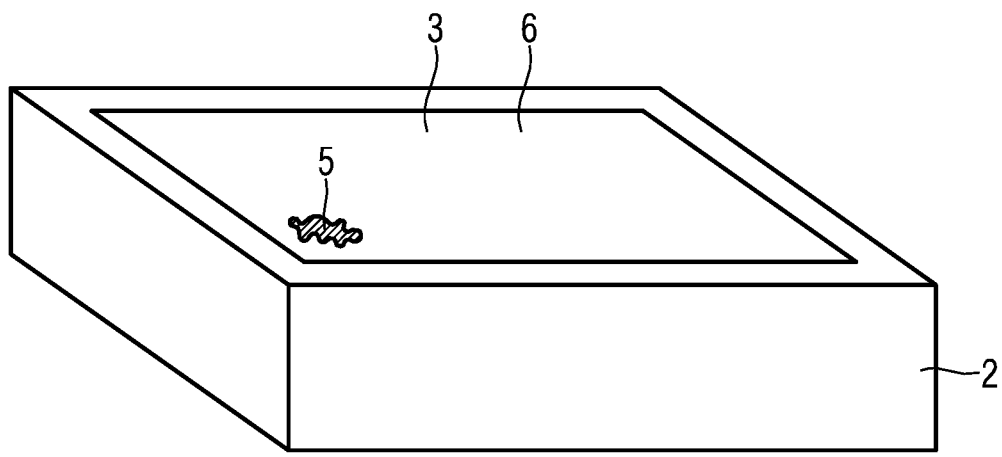
FIGS. 3 and 4 show schematic perspective views of an optoelectronic component according to different examples.

The optoelectronic component according to the example of FIG. 3, in contrast to the optoelectronic component according to the example of FIGS. 1 and 2, has a conversion element 6. The conversion element 6 is suitable for converting electromagnetic radiation generated by the radiation-emitting semiconductor chip 1 at least partially into radiation of a third wavelength range. In this example, on the radiation exit surface 3 of the optoelectronic component a marker element 5 is formed, which has the form of a spot. For example, a marker element 5 with the shape of a spot can be produced by dispensing or jetting the dye substance 4.

For example, the dye substance 4 of the marker element 5 is formed from a resin such as silicone into which fluorescent particles are introduced. The fluorescent particles are preferably suitable for converting electromagnetic radiation of a first wavelength range from the ultraviolet spectral range into electromagnetic radiation of a second wavelength range, which has longer-wavelength ultraviolet radiation than the first wavelength range. The first wavelength range and the second wavelength range are particularly preferably not in the wavelength range which is emitted by the radiation-emitting semiconductor chip 1.

Figure 4:
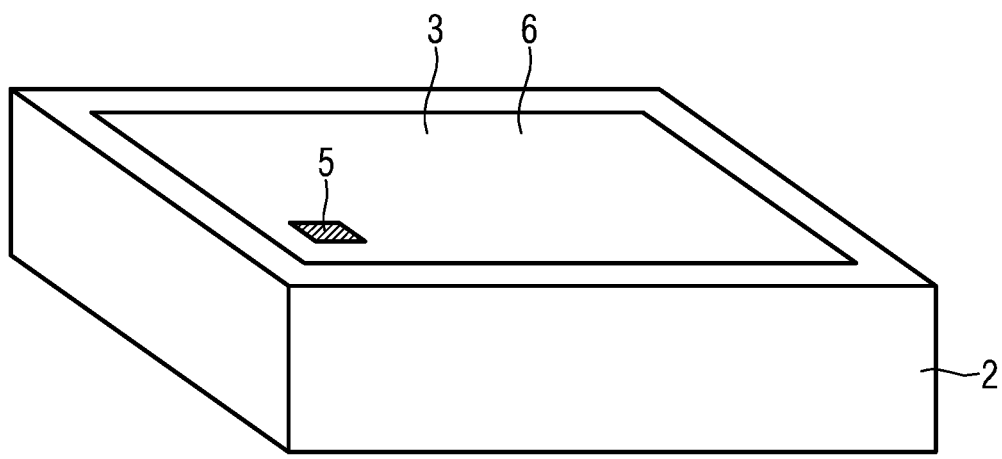

In contrast to the optoelectronic component according to the example of FIG. 3, the optoelectronic component according to the example of FIG. 4 has a marker element 5 designed to be rectangular. The optoelectronic component in this example has a cross-sectional area of approximately 1 millimeter by 1 millimeter. The marker element 5 has an edge length of approximately 140 microns.

This application claims priority of DE 102018103160.2, the subject matter of which is incorporated herein by reference.

Our components and methods are not limited to the examples by the fact that the description is based on them. Rather, this disclosure comprises each new feature, as well as any combination of features, which includes in particular every combination of features in the appended claims, even if the feature or combination itself is not explicitly specified in the claims or examples.

The invention claimed is:

1. An optoelectronic component that emits electromagnetic radiation from a radiation exit surface of the optoelectronic component comprising:
   a radiation-emitting semiconductor chip that produces electromagnetic radiation, and
   a marker element applied to the radiation exit surface of the optoelectronic component, the marker element comprising a dye substance that can be removed from the radiation exit surface using a solvent and/or is permeable to the electromagnetic radiation of the optoelectronic component, wherein
   the dye substance comprises a resin into which fluorescent particles are introduced that convert electromagnetic radiation of a first wavelength range into electromagnetic radiation of a second wavelength range, the first wavelength range and the second wavelength range being within an ultraviolet spectral range.

2. The optoelectronic component as claimed in claim 1, wherein the marker element marks a position of at least one electrical contact of the optoelectronic component.

3. The optoelectronic component as claimed in claim 1, wherein the dye substance is absorbent in the ultraviolet spectral range.

4. The optoelectronic component as claimed in claim 1, wherein the radiation exit surface of the optoelectronic component is no more than 14% smaller than a cross-sectional area of the optoelectronic component.

5. The optoelectronic component as claimed in claim 1, wherein the marker element has a dimension of at least 140 microns.

6. A method of producing an optoelectronic component comprising applying a dye substance to a radiation exit surface of the optoelectronic component to produce a marker element, wherein the dye substance can be removed from the radiation exit surface with a solvent and/or is permeable to the electromagnetic radiation of the optoelectronic component, and the dye substance comprises a resin into which fluorescent particles are introduced that convert electromagnetic radiation of a first wavelength range into electromagnetic radiation of a second wavelength range, the first wavelength range and the second wavelength range being within an ultraviolet spectral range.

7. The method as claimed in claim 6, wherein the dye substance is applied from a cartridge by applying pressure by jetting through a jet valve.

8. The method as claimed in claim 6, wherein the dye substance is applied from a cartridge by applying pressure by dispensing through a needle.

9. The method as claimed in claim 6, wherein the dye substance is applied by inking from an open-pored membrane or a capillary on contact with the radiation exit surface.

* * * * *